United States Patent
Reiter et al.

(10) Patent No.: US 10,107,923 B2
(45) Date of Patent: Oct. 23, 2018

(54) RECEIVING CONTAINER FOR A DETECTOR WHICH OPERATES IN AN ULTRAHIGH VACUUM OR IN A PROTECTIVE GAS ATMOSPHERE CONSISTING OF HIGH-PURITY GAS

(71) Applicants: Universität zu Köln, Köln (DE); Canberra France, Lingolsheim (FR)

(72) Inventors: Peter Reiter, Köln (DE); Jürgen Eberth, Köln (DE); Herbert Hess, Mönchengladbach (DE); Stefan Thiel, Königswinter (DE); Benoit Pirard, Hangenbieten (FR); Jean Clauss, Strasbourg (FR); Louis Delorenzi, Blodelsheim (FR); Marie Odile Lampert, Lingolsheim (FR)

(73) Assignees: Universität zu Köln, Köln (DE); Canberra France, Lingolsheim (FR)

( * ) Notice: Subject to any disclaimer, the term of this patent is extended or adjusted under 35 U.S.C. 154(b) by 0 days.

(21) Appl. No.: 15/528,198

(22) PCT Filed: Nov. 20, 2015

(86) PCT No.: PCT/EP2015/077225
§ 371 (c)(1),
(2) Date: May 19, 2017

(87) PCT Pub. No.: WO2016/079298
PCT Pub. Date: May 26, 2016

(65) Prior Publication Data
US 2017/0322325 A1 Nov. 9, 2017

(30) Foreign Application Priority Data
Nov. 21, 2014 (DE) .......................... 10 2014 223 831

(51) Int. Cl.
*H01L 31/0203* (2014.01)
*G01T 1/24* (2006.01)
*H01L 31/0352* (2006.01)

(52) U.S. Cl.
CPC .......... *G01T 1/244* (2013.01); *H01L 31/0203* (2013.01); *H01L 31/035281* (2013.01)

(58) Field of Classification Search
CPC ................. G01T 1/244; H01L 31/0203; H01L 31/035281
See application file for complete search history.

(56) References Cited

U.S. PATENT DOCUMENTS

| 3,524,985 A | 8/1970 | Sayres |
| 3,609,992 A | 10/1971 | Cacheux |

(Continued)

FOREIGN PATENT DOCUMENTS

| DE | 4324709 A1 | 1/1995 |
| DE | 4324710 A1 | 1/1995 |

(Continued)

OTHER PUBLICATIONS

International Search Report and Written Opinion in corresponding PCT/EP2015/077225 dated Apr. 25, 2016; 17 pgs.

(Continued)

*Primary Examiner* — David Porta
*Assistant Examiner* — Faye Boosalis
(74) *Attorney, Agent, or Firm* — Maier & Maier, PLLC

(57) ABSTRACT

A receiving container for a detector which operates in an ultrahigh vacuum or in a protective gas atmosphere that consists of high-purity gas. The receiving container has a receiving portion which forms at least a portion of the receiving space for the detector, and a cover for hermetically sealing the receiving space. A first sealing surface is arranged at the receiving portion and a second sealing (Continued)

Figure 1:
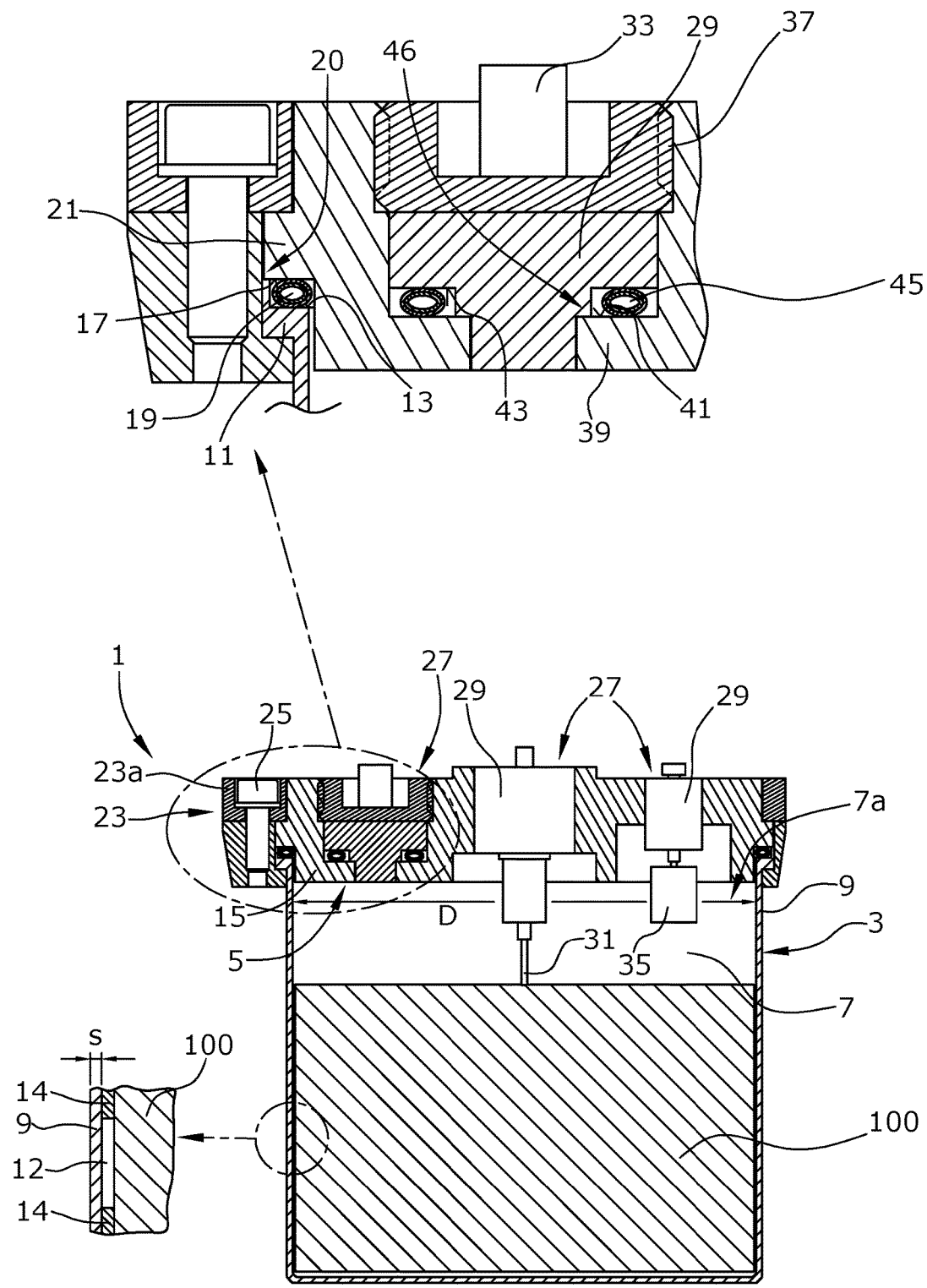
Figure 1A:
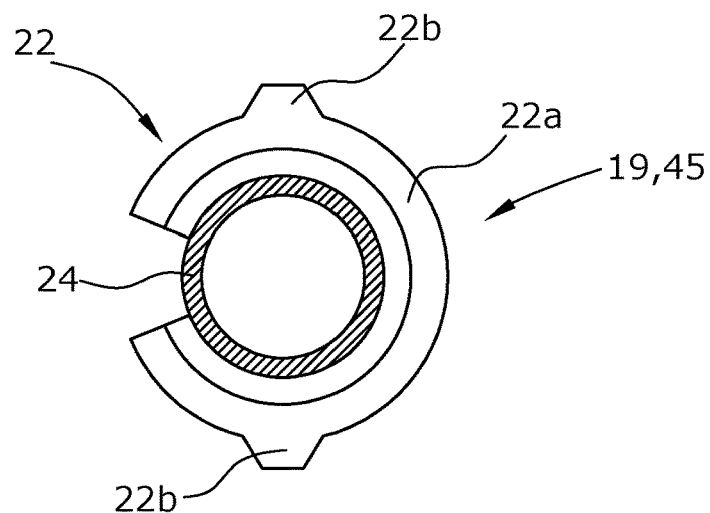

surface matching the first sealing surface is arranged at the cover. Between the sealing surfaces a gasket is arranged. A securing device presses the cover against the receiving portion to provide a defined contact pressure of the gasket.

15 Claims, 4 Drawing Sheets

(56) References Cited

U.S. PATENT DOCUMENTS

| | | |
|---|---|---|
| 5,646,407 A | 7/1997 | Berst et al. |
| 2004/0164250 A1 | 8/2004 | Cork |
| 2005/0285046 A1 | 12/2005 | Iwanczyk et al. |

FOREIGN PATENT DOCUMENTS

| | | | |
|---|---|---|---|
| GB | 2106641 A1 | 4/1983 |
| WO | 87/05990 A1 | 10/1987 |

OTHER PUBLICATIONS

Technetics Group EnPro Industries companies, "Helicoflex® Spring Energized Seals", Published: Nov. 20, 2014, 17 pgs.

Robert Flitney, "Seals and Sealing Handbook", Published: May 2007, 6 pgs.

RECEIVING CONTAINER FOR A DETECTOR WHICH OPERATES IN AN ULTRAHIGH VACUUM OR IN A PROTECTIVE GAS ATMOSPHERE CONSISTING OF HIGH-PURITY GAS

The present invention relates to a receiving container for a detector operating in an ultrahigh vacuum (UHV) or in a protective gas atmosphere consisting of high-purity gas, having a receiving portion forming at least a portion of the receiving space for the detector and a cover for gastightly sealing the receiving space.

In the field of research, but also in the industry, detectors are employed which operate in an ultrahigh vacuum or in a highest-purity protective gas at very low temperatures of <−200° C., for example.

Examples of such detectors are semiconductor detectors for the high-resolution γ-spectroscopy, wherein, generally, diodes of germanium, silicon, cadmium-zinc-telluride, gallium-arsenide or cadmium-telluride are used. In this patent application, the radiation-sensitive detector material and thus the aforementioned diodes, for example, are considered as the detector.

It has turned out that detectors of high-purity germanium are particularly advantageous, which stand out due to a very good energy resolution and a high probability of detection of γ-radiation. Due to these characteristics these detector materials are employed in the field of nuclear-physical basic research, protection against radiation, environmental monitoring, nondestructive material analysis, industrial manufacturing control or even in the space research.

For measuring purposes, detectors made of high-purity germanium must be cooled down to temperatures of up to −200° C. for suppressing the thermal noise of the diodes. It is common practice to install the detectors into a vacuum cryostat which also protects the sensitive surface of the detector from contamination.

Normally, the designs of the cryostats are matched to the respective measuring task. Due to the sensitivity of the intrinsic surface of the detectors to contamination, the detectors can be installed into the cryostat only by the detector manufacturer. This means that the user normally requires different cryostats containing detectors for different measuring tasks.

Another drawback of the conventional cryostat technology is that it is difficult to realize an assembly of many tightly packed detectors as is required for the environmental monitoring from aircraft or for the space research, for example.

Therefore, hermetically encapsulated detectors have been developed, which considerably improved the reliability of the detectors and allowed for a setup of compact multi-detector systems in a common cryostat. Such encapsulated detectors are known from DE 43 24 709 and DE 43 24 710, for example.

In the case of these detectors a container is provided which closely surrounds the detector. The container is composed of a receiving portion which is closed by a cover. The cover is welded to the receiving portion in the vacuum by means of an electron beam or laser radiation. In the cover passages are provided through which the lines for the detector high voltage, signal lines or a pumping pipe for evacuating the detector are guided by means of inserts. The inserts are welded into the passages. Furthermore, on the inside of the cover a getter element is arranged which maintains a vacuum of <$10^{-6}$ mbar in the temperature range between −200° C. and 200° C. over decades. This temperature range is required since on the one hand an operating temperature of approximately −190° C. is necessary for measuring purposes, and on the other hand radiation-induced crystal damage in the detectors can be remedied at a temperature between 80-200° C.

The manufacture of the known container is relatively complex, in particular the welding processes for installing the inserts into the cover and the closing of the container. Defects can however be revealed only when the detector is in operation and has been cooled down to the operating temperature of −190° C. If defects have occurred during the production process, the container can be opened again only by milling off the weld seam. In the case of a suitable design of the weld lip the container can normally be closed again for another time by welding. If the container has to be opened again, it must be completely renewed. This is particularly problematic since in the course of several years of measuring operation the properties of the germanium diode may deteriorate such that a repair of the detector accommodated in the container is required. This usually results in one or several processes of opening the container over the lifetime.

The manufacture of a ready-for-use detector with a container as well as the repair of the same thus incur high costs.

Furthermore, location-sensitive detectors exist where the contacts of the germanium diodes are segmented. The manufacturing process of such segmented detectors and suitable containers is considerably more complex as compared with standard detectors such that the failure rate during production is considerably higher. The function of such detectors can however be checked only after installation into a container such that in the case of such detectors it is particularly frequently required to subsequently open a container. Hence in the case of such types of detectors the previously used technology results in particularly high production and repair costs.

Furthermore, during the welding process on the container a high amount of heat is introduced into the container and gases and vapor may be produced which may precipitate on the detector. In addition, the introduction of heat leads to a reduction of the strength of the container and the cover in the area of the heat-affected zone. Therefore it is necessary to take special protective measures regarding the detector, as is described in DE 43 24 710, for example. Thus the installation of the detector into the receiving container becomes much more complicated.

It is therefore an object of the present invention to provide a receiving container for a detector which operates in an ultrahigh vacuum or in a protective gas atmosphere consisting of high-purity gas, where the installation into the receiving container is facilitated and furthermore maintenance or repair of the detector is facilitated and possible without destroying the container.

The invention is defined by the features of claim 1.

In the case of the receiving container according to the invention for a detector which operates in an ultrahigh vacuum or in a protective gas atmosphere consisting of high-purity gas and made of a radiation-sensitive material, having a receiving portion forming at least a portion of the receiving space for the detector and a cover for gastightly sealing the receiving space, it is envisaged that at the receiving portion a first sealing surface and at the cover a second sealing surface matching the first sealing surface are arranged and that between the sealing surfaces a gasket is arranged, wherein a securing device presses the cover against the receiving portion to provide a defined contact pressure of the gasket. According to the invention, radiation-sensitive detector materials are considered as detector, which may be provided as a block having at least partially a hexagonal cross-section. The cover elastically deforms the gasket arranged between the first and second sealing surfaces, wherein the former presses at a defined contact pressure against the first and second sealing surfaces. The receiving portion thus defines a receiving opening of the receiving space which is adapted to be closed by the cover.

According to the invention, gastight sealing means sealing the receiving space against air or a gas contained in the receiving space. This is mainly performed to protect the highly sensitive detector surface from contamination. Depending on the requirement, the tightness is to be effective in one direction or in both directions. Thus it is to be ensured that, when a protective gas atmosphere consisting of high-purity gas is employed, said gas does not escape from the container and/or no air or no other gas enters the receiving container from outside. When the receiving container is used in an ultrahigh vacuum it is to be ensured that no gas or no air enters the receiving container from outside. In a frequently employed application the receiving container is operated in a vacuum to ensure cooling with liquid nitrogen. In such an application the gastight sealing of the receiving space is to ensure that a predefined gas pressure is maintained in the receiving space. The receiving container according to the invention is adapted to be opened in a nondestructive manner and thus be reused due to the provision of cover, securing device and gasket, i. e. the elaborately produced receiving containers can be equipped with new detectors or it is possible to repair a detector.

The receiving containers according to the invention are adapted to be used in particular in a temperature range from −200° C. to +200° C. The detectors normally operating at a temperature of up to −200° C. may be damaged by radiation during use. Such damage can be remedied during regeneration of the detector at temperatures in the range of up to +200° C. Thus the receiving containers and the detectors contained therein are subjected to a temperature ranging between −200° C. and +200° C.

The securing device can in particular be configured as a detachable device. In particular, the securing device can be configured a one- or multi-piece detachable locking ring which presses against the cover.

Thus it is realized that the receiving container can be re-opened in a simple manner such that a repair or a replacement of the detector accommodated in the receiving container is possible in a simpler manner since the detector can easily be accessed. Furthermore, the receiving container can be reused more frequently than a welded container since the receiving container can be opened by removing the cover after detaching the securing device. This can easily be carried out in a nondestructive manner.

The receiving container encapsulates the detector and gastightly surrounds it. After the receiving space has been evacuated and/or when the high-purity gas is introduced into the receiving space, the detector can be set to the optimum operating temperature and is ready for use.

By providing a securing device which presses the cover against the receiving portion a defined contact pressure of the gasket can be generated, whereby the container can be gastightly sealed in an advantageous manner. For a detector which operates in a protective gas atmosphere consisting of high-purity gas the gasket provides the required tightness with regard to this gas.

By selecting a suitable gasket and providing the contact pressure suitable for this gasket by means of the securing device, a maximum leakage rate in the required temperature range can be provided in an advantageous manner. Furthermore, it can be ensured that the defined contact pressure does not damage the first and second sealing surfaces such that a reusability of the receiving container without treating the first and second sealing surfaces is ensured.

The receiving portion can be configured as a cup, for example. In particular, it may be envisaged that the shape of the receiving portion matches the outer contour of the detector such that the receiving portion tightly rests against the detector.

The receiving portion may comprise thin walls. For example, it may be envisaged that the wall thickness of the walls of the receiving portion ranges between 0.7% and 1.5% of the maximum diameter of the receiving opening. The maximum diameter is considered the maximum extension of the receiving opening. In the case of a round receiving opening the maximum diameter amounts to twice the radius of the receiving opening, in the case of an elliptical receiving opening the maximum diameter amounts to twice the length of the semi-axis, for example. For instance, the maximum diameter of the receiving opening may range between 60 mm and 80 mm. The wall thickness may range between 0.7 mm and 0.8 mm, for example. Such a wall thickness has turned out to be particularly advantageous with regard to an adequate stability of the receiving portion for accommodating the detector and for simultaneously minimizing the barrier formed by the walls with regard to the radiation to be detected.

The receiving portion and/or the cover can be made from an aluminum alloy, for example AlMg4.5Mn, or from titanium or magnesium or a titanium or magnesium alloy.

Between the detector and the walls of the receiving portion a gap may be provided. Thus an electrical isolation of the detector and the walls of the receiving portion is realized. In the case of receiving containers made of an electrically conductive material an electrical isolation is required to allow for electrically contacting the detector for the purpose of picking up signals. The gap may have a width ranging between 0.3 mm and 0.5 mm. Such a gap width has turned out to be particularly advantageous for realizing an electrical isolation and for simultaneously preventing the gap from forming a barrier for the radiation to be detected. Furthermore, a very compact design can be achieved.

Between the walls and the detector spacers may be arranged which keep the detector at a distance to the walls for the purpose of providing a gap. The spacers may be made from a ceramic material or a heat-resistant plastic material, such as polyimide, e. g. Kapton, available from DuPont, for example.

According to the invention, it may be envisaged that the gasket is an elastic metal gasket. The elasticity ensures that the contact pressure of the gasket is maintained almost unchanged in a larger temperature range. In the case of germanium detectors this temperature ranges between −200° C. and 200° C., for example. The elasticity of the gasket compensates for thermal expansions occurring in this temperature range such that the tightness of the receiving container is ensured.

Preferably, it is envisaged that the gasket is a spiral spring surrounded by an elastic tube, preferably a metal tube. The tube may be slit, for example.

Such a gasket has turned out to be particularly advantageous. In particular, with such a gasket the desired leakage rate of <10-10 mbar×l/s, for example, can be reached in an advantageous manner.

Preferably, it is envisaged that the material of the elastic tube in contact with the first and second sealing surfaces has a lower hardness than the material of the first and second sealing surfaces. In this manner it is realized that any surface roughness of the sealing surfaces can be compensated for in that the material of the tube is at least partially slightly plastically deformed and pressed into depressions of the surface of the sealing surfaces. The first and second sealing surfaces may have an arithmetical mean roughness index Ra in the range between 0.2 µm and 0.8 µm, for example.

The material of the elastic tube (outer material) in contact with the first and second sealing surfaces may be configured as a separate layer, for example. For instance, the material of the elastic tube in contact with the first and second sealing surfaces may be made from pure aluminum, for example Al99.5. In the case of first and second sealing surfaces made of an aluminum alloy, such as AlMg4.5Mn, it is realized that the outer material of the elastic tube is deformed but the sealing surfaces are not.

The spiral spring may be made from spring steel, for example high-alloy steel, for instance type XC80. On the side facing the first and second sealing surfaces the tube may comprise a respective protrusion via which the tube rests against the first and second sealing surfaces. Thus a force required for the plastic deformation of the material is reduced since said force acts upon a smaller area.

Damage to the sealing surface, when the contact pressure is applied, is avoided since the material of the tube is capable of plastically deforming. Thus it can be realized that the receiving container according to the invention is reusable since the first and second sealing surfaces have the properties required for reuse even after use of the receiving container.

Preferably, it is envisaged that a stopper for the cover is provided at the receiving portion, wherein, when the cover rests upon the stopper, a predefined distance exists between the first and second sealing surfaces. In this manner it is ensured that the gasket arranged between the first and second sealing surfaces is deformed only to the extent defined by the distance such that the deformation of the gasket is limited. Due to this elastic deformation of the gasket it presses at a defined contact pressure against the first and second sealing surfaces.

According to a preferred exemplary embodiment of the invention, it is envisaged that the receiving space comprises a first circumferential flange upon which rests the securing device. Furthermore, it may be envisaged that the cover comprises a second circumferential flange upon which rests the securing device. Thus the securing device can fasten the receiving portion and the cover to each other in an advantageous manner.

Preferably, it is envisaged that the first sealing surface is provided at the first flange and/or that the second sealing surface is provided at the second flange. Since the flanges protrude from the receiving portion and the cover, they can be treated in an advantageous manner during the manufacture of the receiving portion and the cover so that the sealing surfaces can be manufactured in a simple manner such that they are of good quality.

When the securing device rests upon the first and second flanges, the pressure required for closing the receiving container is directly exerted upon the flanges such that the arrangement of the sealing surfaces at the first and second flanges offers the advantage that the pressure is exerted upon the cover and the receiving portion in the immediate vicinity of the first and second sealing surfaces and thus a particularly exact contact pressure of the gasket can be provided without deformations at the cover or the receiving portion, which may unintentionally change the distance between the first and second sealing surfaces, resulting in inaccuracies.

Preferably, it is envisaged that the securing device is configured as a two-piece locking ring which encompasses the first and second flanges. Thus the first and second flanges can be pressed against each other in an advantageous manner. Furthermore, no other means, such as screw holes or the like, are required at the cover or the receiving portion. Thus the cover and the receiving portion can be manufactured in an advantageous manner, wherein, furthermore, deformations at the cover or the receiving portion are avoided when the cover is fastened to the receiving portion.

For example, it may be envisaged that the cover and the receiving portion are round, whereas the two-piece locking ring is polygonal, for example hexagonal, having a shape matching the cover and the receiving portion. In the material reinforcements existing in the corner area of the locking ring screws may be provided with the aid of which the two-piece locking ring is screwed together and the cover is pressed against the receiving portion.

Furthermore, it may be envisaged that the cover comprises a protruding area which is adapted to be partially inserted into the receiving portion. Thus centering of the cover can be ensured.

By providing the two-piece locking ring which encompasses the first and second flanges it is furthermore ensured that the gasket located between the sealing surfaces provided at the first and second flanges is protected from external influences since the locking ring prevents the gasket from being accessed from outside. Here, it may be envisaged that a portion of the two-piece locking ring extends across the area in which the gasket is arranged, and thus protects this area.

In a second exemplary embodiment of the invention which is an alternative to the exemplary embodiment with the circumferential flange, it is envisaged that the receiving portion comprises a receiving opening surrounded by a wall of the receiving portion, wherein the receiving opening transitions into the receiving space, wherein the cover is adapted to be inserted into the receiving opening, and wherein the first sealing surface is provided at a protrusion of the wall extending into the receiving opening. While in the first described exemplary embodiment the cover only partially extends into the receiving space at the upper edge area and is placed upon the receiving portion to a large extent, in this exemplary embodiment it is envisaged that the cover is inserted into the receiving portion. Here, it is envisaged that the wall comprises an internal thread and the securing device comprises an external thread which cooperates with the internal thread. In other words, the securing device can be screwed into the receiving opening. Here, the securing device can be a one-piece locking ring, for example.

Thus it is possible to press the securing device against the cover and thus the sealing surfaces against the gasket in a simple manner.

In the securing device clamping screws may be provided which press against the cover and interlock the securing device to the internal thread. Thus, on the one hand, a defined contact pressure of the gasket can be attained in an advantageous manner and, on the other hand, the securing device can be prevented from detaching and thus the contact pressure from being reduced.

In the two alternative exemplary embodiments of the invention it may be envisaged that the cover comprises at least one passage for inserting an insert with a getter element, an insert with a tube for evacuating the receiving space or an insert for an electric line or an electric plug connector. With the aid of the getter element a vacuum generated in the receiving space can be maintained in an advantageous manner for several years. The provision of an insert with a tube for evacuating the receiving space allows for producing a vacuum in the receiving space in a simple manner. Of course, it is also possible to provide a desired protective gas atmosphere via the tube.

By means of the insert for an electric line or a plug connector the detector high voltage required for the operation can be applied to the detector. It is also possible to lead signal lines to the outside via further electric plug connectors.

Here, it may be envisaged that the passage comprises a third sealing surface provided at a protrusion and the insert comprises a fourth sealing surface, wherein a further gasket is arranged between the third and fourth sealing surfaces. The inserts can thus be detachably fastened in the cover such that in the case of repair of the receiving container according to the invention the getter element can be replaced, for example. It is also possible to provide an insert with a new tube for evacuating the receiving space.

The gasket may be a metal gasket, for example, and may be identical or similar to the gasket between the cover and the receiving portion. In particular, the further gasket may be constituted by a spiral spring surrounded by an elastic tube. Furthermore, it may be envisaged that the material of the elastic tube in contact with the third and fourth sealing surfaces has a lower hardness than the material of the third and fourth sealing surfaces. Thus it can be realized that the receiving container according to the invention is reusable since the third and fourth sealing surfaces have the properties required for reuse even after use of the receiving container.

Preferably, it is envisaged that a further stopper for the insert is provided at the cover, wherein, when the insert rests upon the further stopper between the third and fourth sealing surfaces, a predefined distance exists. In this manner it is ensured that the further gasket arranged between the third and fourth sealing surfaces is deformed only to the extent defined by the distance such that the deformation of the further gasket is limited. Due to this elastic deformation of the further gasket it presses at the defined contact pressure against the third and fourth sealing surfaces. The insert can be configured such that it is adapted to be screwed into the passage. This allows for detachably inserting the insert in a simple manner into the passage. For this purpose, the passage may comprise an internal thread, wherein the insert comprises an external thread matching this thread. By screwing the insert into the passage a necessary defined contact pressure for the further gasket can be provided in an advantageous manner.

Alternatively, it may be envisaged that a further securing device is adapted to be screwed into the passage and presses the insert against the further gasket. Here, it may be envisaged that in the further securing device clamping screws are arranged which press against the further insert and restrain further securing devices in the passage. Thus a defined contact pressure for the further gasket can be provided, wherein at the same time the insert is secured by being restrained in the passage.

The elastic metal gasket according to the invention having a tube surrounding a spiral spring offers the advantage that the contact pressure required for a desired tightness may be considerably lower than in the case of standard gaskets used in the ultrahigh vacuum technology, or that in the temperature range the desired tightness can be maintained in an advantageous manner, for example. Thus very compact configurations of the receiving container according to the invention are possible. Furthermore, the load exerted by the gasket upon the sealing surface is lower. The receiving container and the cover can thus entirely be manufactured from materials, in particular metals or metal alloys, with a low atomic number Z, which is of particular advantage in the γ-spectroscopy since the absorption and the scattering of gamma radiation by these materials is minimized.

The tubes of the gasket may be coated with a desired material, for example. Thus the gaskets can be matched in an advantageous manner to nearly all flange materials. Depending on the application, thus different materials can be used for the receiving container, for instance materials with a high strength for space projects or materials with a low X-ray fluorescence for the γ-spectroscopy.

Furthermore, in the receiving container according to the present invention deformations are avoided by welding the cover and the receiving portion to each other.

Thus the production of the receiving container as well as the arrangement of the detector in the container can be facilitated. Furthermore, the risk of damage to the detector is reduced since no welding process is carried out.

The invention further relates to a detector system having a receiving container according to the invention in which a detector is accommodated.

In addition, the receiving container according to the invention allows for a simpler repair of the detector or a detector system composed of the receiving container with a detector since the receiving container can be opened and closed again in a simple manner.

Figure 2:
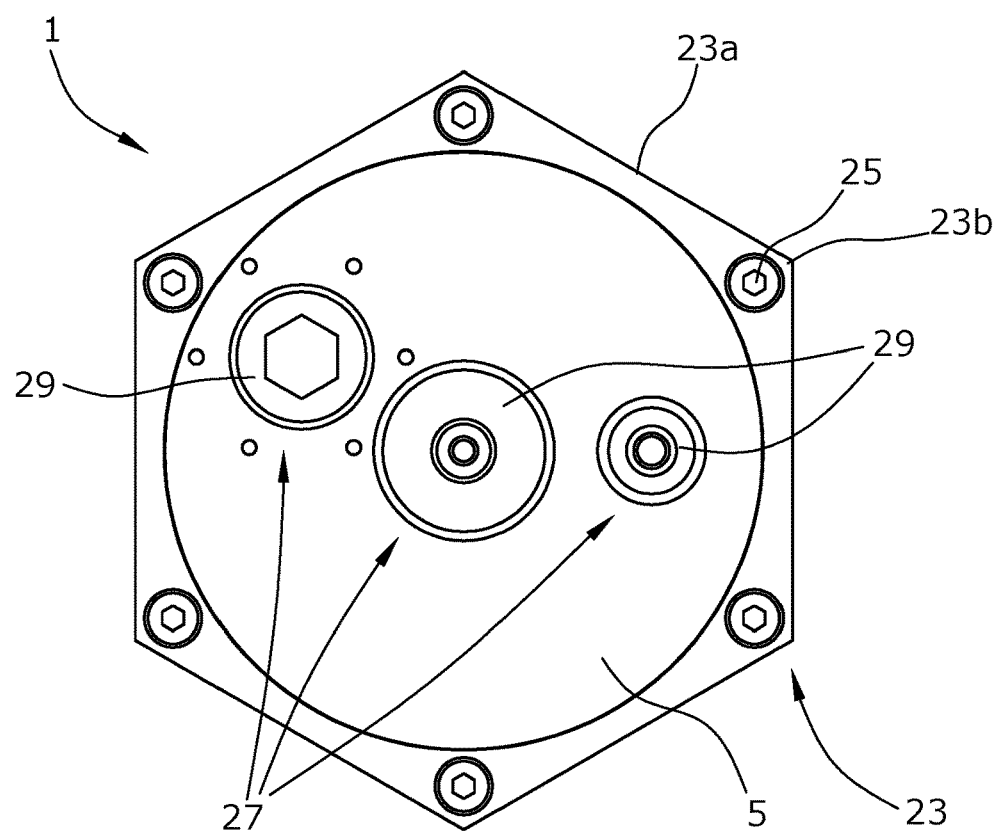
Figure 3:
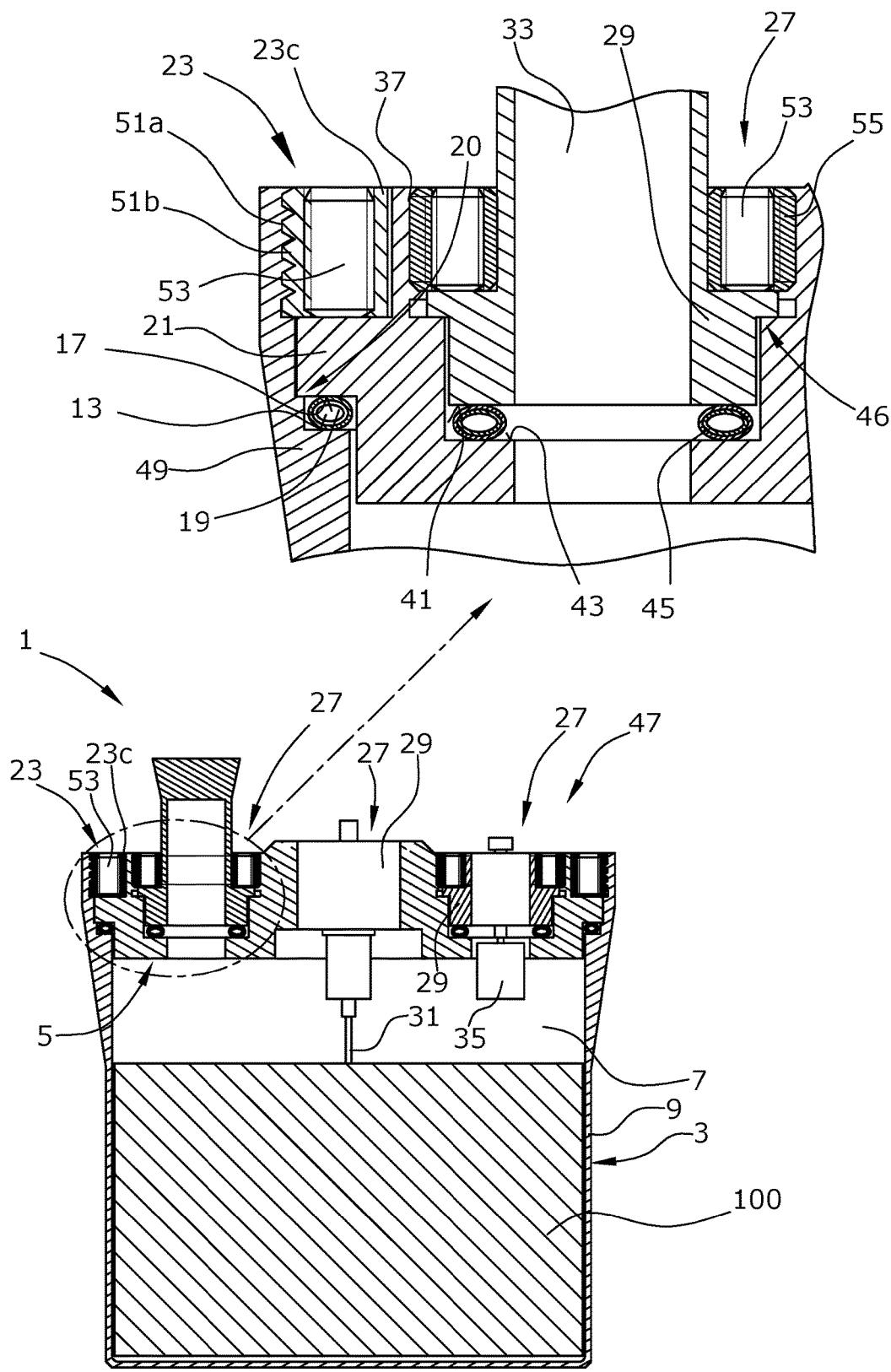
Figure 4:
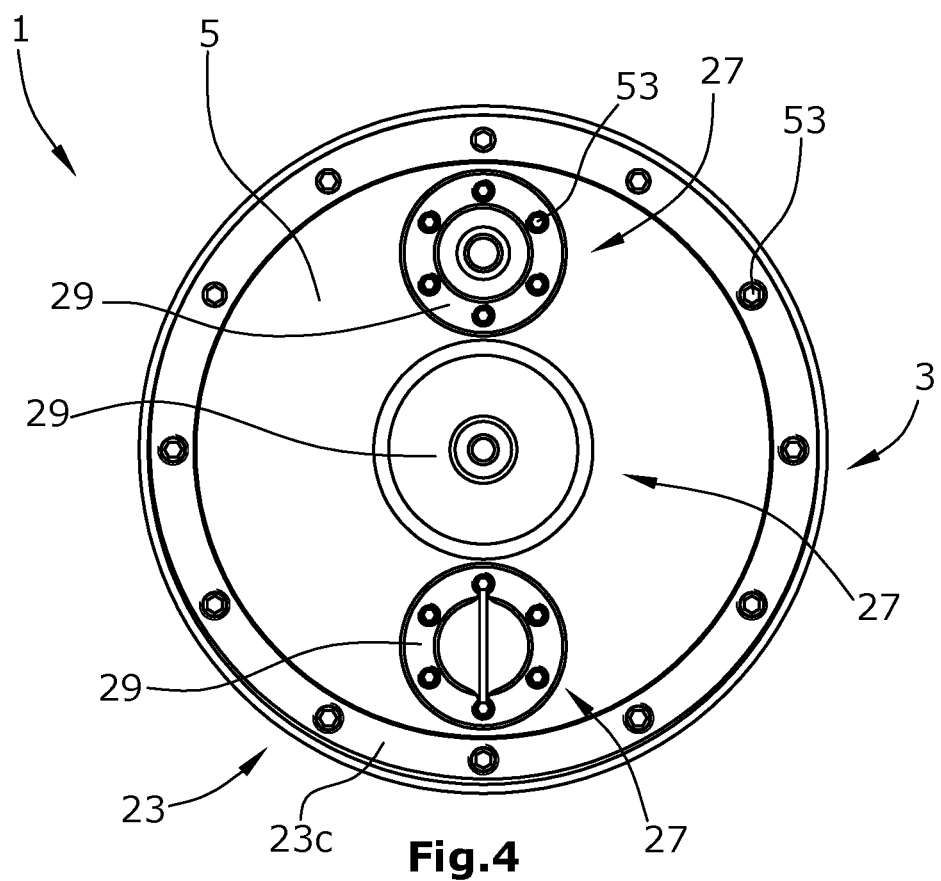

Hereunder the invention is described in detail with reference to the figures in which FIG. 1 shows a schematic sectional view of a first exemplary embodiment of a receiving container with a detector according to the invention, FIG. 2 shows a schematic top view of the receiving container illustrated in FIG. 1, FIG. 3 shows a schematic sectional view of a second exemplary embodiment of a receiving container with a detector according to the invention, and FIG. 4 shows a schematic top view of the receiving container illustrated in FIG. 3.

In FIGS. 1 and 2 a first exemplary embodiment of a detector system having a receiving container 1 according to the invention with the detector 100 made of radiation-sensitive detector material and accommodated in the receiving container is illustrated. The detector 100 operates in an ultrahigh vacuum or in a protective gas atmosphere consisting of high-purity gas. The vacuum or the protective gas atmosphere is generated in the receiving container and maintained over a long period of time.

The receiving container is composed of a receiving portion 3 and a cover 5 which is fastened to the receiving portion 3. The receiving portion 3 is of a cup-shaped configuration, for example.

The receiving portion 3 defines a receiving space 7 for the detector 100. Of course, it is also possible that the receiving portion 3 forms only a portion of the receiving space 7 for the detector 100, and a further portion of the receiving space 7 is formed by the cover 5.

The cover hermetically or gastightly seals a receiving opening 7a of the receiving space 7 such that the atmosphere generated in the receiving space 7 can be maintained.

The receiving portion 3 is composed of a wall 9 which annularly surrounds the receiving space 7. At the upper edge of the wall 9 a first circumferential flange 11 is arranged. The surface of the flange 11 forms a first sealing surface 13. The wall thickness s of the wall 9 ranges between 0.7 and 1.5% of the maximum diameter D of the receiving opening 7a, for example.

During assembly the detector 100 is inserted into the receiving portion 3 through the receiving opening 7a. Between the wall 9 and the detector 100 a gap 12 exists. Thus an electrical isolation of the detector 100 and the wall 9 of the receiving portion 3 is realized. The gap 12 may have a width ranging between 0.3 mm and 0.5 mm. Such a gap width has turned out to be particularly advantageous for realizing an electrical isolation and for allowing for a very compact design, wherein at the same time the gap 12 is prevented from providing a barrier for the radiation to be detected.

Between the wall 9 and the detector 100 spacers 14 are arranged which keep the detector 100 at a distance to the wall 9 for forming the gap 12. The spacers can be made from a ceramic material or a heat-resistant plastic material, for example.

The cover 5 comprises a protruding portion 15 which extends into the receiving opening 7a of the receiving portion 3 and thus is centered by the upper portion of the wall 9 of the receiving portion 3. Furthermore, a second sealing surface 17 is arranged at the cover 5. The first and second sealing surfaces 13, 17 match each other and are arranged opposite each other. Between the first and second sealing surfaces 13, 17 a gasket 19 is arranged which rests upon the first and second sealing surfaces 13, 17. The cover 5 comprises a second flange 21 on which the second sealing surface 17 is arranged.

A securing device 23 presses the cover 5 against the receiving portion 3 and provides a defined contact pressure of the gasket 19. Thus the receiving space 7 can be hermetically or gastightly sealed in an advantageous manner. For this purpose, it is envisaged that a stopper 20 for the cover 5 is provided at the receiving portion 3, wherein, when the cover 5 rests upon the stopper 20, a predefined distance exists between the first and second sealing surfaces 13, 17. In this manner, it is ensured that the gasket 19 arranged between the first and second sealing surfaces 13, 17 is deformed only to the extent defined by the distance. Due to this elastic deformation of the gasket 19 it presses at the defined contact pressure against the first and second sealing surfaces 13, 17.

The securing device 23 is composed of a two-piece locking ring 23a which encompasses the first and second flanges 11, 21 and presses them against each other. For this purpose, the two-piece locking ring 23a is fastened by a screw. The two-piece locking ring 23a is of a hexagonal configuration, as can best be seen in FIG. 2, wherein screws 25 are arranged in the corner areas 23b of the locking ring 23a.

In the cover 5 a plurality of passages 27 may be provided in which inserts 29 are arranged. The inserts 29 may accommodate a high-voltage line 31 for the detector 100, a tube 33 for evacuating the receiving space 7 or a getter element 35. The getter element 35 serves for maintaining the vacuum in the receiving space 7 for several years, for example.

As illustrated in FIG. 1 by the example of the insert 29 with the tube 33, the insert 29 can be screwed into the passage 27 via a thread 37. The passage 27 comprises protrusions 39 which provide a third sealing surface 41. At the insert 29 a fourth sealing surface 43 is provided which matches the third sealing surface 41. Between the third and fourth sealing surfaces 41, 43 a further gasket 45 is arranged, wherein the insert 29 is adapted to be screwed into the passage 29 such that a defined contact pressure acting upon the further gasket 45 can be provided. At the cover 5 the protrusions 39 form a further stopper 46 for the insert 29, wherein, when the insert 29 rests upon the further stopper 46, a defined distance is provided between the third and fourth sealing surfaces 41, 43. In this manner, it is ensured that the further gasket 45 arranged between the third and fourth sealing surfaces 41, 43 is deformed only to the extent defined by the distance. Due to this elastic deformation of the further gasket 45 it presses at the defined contact pressure against the third and fourth sealing surfaces 41, 43.

The gasket 19 and the further gasket 45 may be configured as elastic metal gaskets. A corresponding gasket 19, 45 is schematically shown in FIG. 1 in an enlarged sectional view. Here, the gaskets 19, 45 can be composed of a spiral spring 24 surrounded by an elastic slit tube 22. Furthermore, it may be envisaged that the elastic tube of the gaskets comprises a separate layer 22a made of pure aluminum, for example, wherein the material of the elastic tube 22 in contact with the first and second sealing surfaces 13, 17 or the third and fourth sealing surfaces 41, 43 has a lower hardness that the corresponding sealing surfaces 13, 17, 41, 43. Thus it is realized that the surface roughness of the sealing surfaces 13, 17, 41, 43 is compensated for and damage to the sealing surfaces 13, 17, 41, 43 is prevented.

The separate layer may comprise a respective protrusion 22b on the side facing the sealing surfaces 13, 17, 41, 43, via which protrusion the elastic tube 22 rests upon the sealing surfaces 13, 17, 41, 43. Thus a force required for the plastic deformation of the material of the separate layer 22a is reduced since said force acts upon a smaller area formed by the protrusions.

The receiving container 1 according to the invention can be closed in a simple manner in that the securing device 23 presses the cover 5 against the receiving portion 3 after the cover 5 has been placed upon the receiving portion 3. For this purpose, the screws 25 are tightened at a defined torque. Opening of the receiving container 1 according to the invention can be carried out in a simple manner by loosening the screws 25, wherein the container can be opened in a nondestructive manner.

Due to the use of the inserts 29 which are screwed into the passages 27 the getter element 35 or the tube 33 can be replaced in a simple manner, for example.

The inserts 29 may also comprise other electric lines or electric plug connectors which are used for signal transmission, for example.

In the illustrated exemplary embodiment, the receiving portion 3 is of a round configuration. Depending on the shape of the detector 100, the receiving portion 3 may have a different shape. In particular, the receiving portion 3 may comprise flattened portions such that a plurality of detectors arranged in the receiving container 1 can be disposed close to each other in that the flattened portions rest upon each other. Thus a tight arrangement of the detectors can be realized such that they can jointly be set to a low operating temperature of −200° C. in an advantageous manner by employing the cryostat technology, for example.

The detector 100 may comprise diodes made of germanium, silicon, cadmium-zinc-telluride, gallium-arsenide or cadmium-telluride, for example. In particular, the detector can be made of high-purity germanium.

In FIGS. 3 and 4 a second exemplary embodiment of a detector system having the receiving container 1 according to the invention with the detector 100 is illustrated. The receiving container 1 illustrated in FIGS. 3 and 4 essentially has a similar setup as the receiving container 1 illustrated in FIGS. 1 and 2 and is also composed of a receiving portion 3 and a cover 5. The difference is the way of fastening the cover 5 to the receiving portion 3.

In the exemplary embodiment illustrated in FIGS. 3 and 4 the receiving portion 3 comprises a receiving opening 47 surrounded by the wall 9 of the receiving portion 3 and transitioning into the receiving space 7. The cover 5 is inserted into the receiving opening 47. The first sealing surface 13 is provided at a protrusion 49 extending into the receiving opening 47. The cover 5 may comprise, in a similar manner as the cover 5 in the exemplary embodiment illustrated in FIGS. 1 and 2, a second flange 21 at whose lower side the second sealing surface 17 is provided. The gasket 19 is arranged between the first and second sealing surfaces 13, 17 and may be configured in the same manner as in the exemplary embodiment shown in FIGS. 1 and 2.

The securing device 23 is configured as a one-piece locking ring 23c in the exemplary embodiment illustrated in FIGS. 3 and 4. The wall 9 comprises an internal thread 51a in the area of the receiving opening. The one-piece locking ring 23c comprises an external thread 51b matching the internal thread 51a and cooperating with the internal thread 51a. In other words, the one-piece locking ring 23c can be screwed into the receiving opening 47 and press against the cover 5.

In the securing device 23 clamping screws 53 are arranged which press against the cover 5. By means of the clamping screws 53 the securing device 23 can be restrained in the thread 51a,b and a defined pressure can be exerted upon the cover 5, whereby the latter is pressed against the stopper 20 provided at the receiving portion. Thus the gasket 19 is elastically deformed and presses at the defined contact pressure against the first and second sealing surfaces 13, 17.

As in the exemplary embodiment illustrated in FIGS. 1 and 2, passages 27 for accommodating the inserts 29 are arranged in the cover 5. In the exemplary embodiment illustrated in FIGS. 3 and 4 the inserts 29 are inserted into the passages 27 such that the third sealing surface 41 and the fourth sealing surface 43 with the intermediate gasket 45 cooperate with each other. The inserts 29 are defined by means of a further securing device 55 which is screwed into the thread 37 in the passage 27. Furthermore, the further securing device 55 also comprises clamping screws 53 which restrain the further securing device 55 in the passage 27 and provide a defined contact pressure for the further gasket 45 in that the inserts 29 are pressed against the further stoppers 46.

Fastening of the inserts 29 in the passages 27 is thus performed essentially in the same manner as fastening of the cover 5 to the receiving portion 3.

In the exemplary embodiment illustrated in FIGS. 1 to 4 only individual inserts are shown as having been fastened by means of the described fastening technique. Of course, all inserts can be fastened in this manner. Also, it is possible that only individual inserts which are to be replaced during a repair are fastened in this manner and other inserts are welded to the cover 5 in a conventional manner.

The invention claimed is:

1. A receiving container for a detector which operates in an ultrahigh vacuum or in a protective gas atmosphere consisting of high-purity gas; comprising
a receiving portion which forms at least a portion of the receiving space for the detector and a cover for hermetically sealing the receiving space, wherein at the receiving portion a first sealing surface and at the cover a second sealing surface matching the first sealing surface are arranged, and between the sealing surfaces a gasket is arranged, wherein a securing device presses the cover against the receiving portion for providing a defined contact pressure of the gasket, wherein the gasket is an elastic metal gasket, wherein the gasket is composed of a spiral spring surrounded by an elastic tube, wherein, when the contact pressure is applied to one or more protrusions on the elastic tube of the gasket, the material of the tube is capable of plastically deforming such that damage to the sealing surface is avoided and wherein for an electrical isolation of the detector and the walls of the receiving portion, a gap is provided between the detector and the walls of the receiving portion.

2. The receiving container according to claim 1, wherein the material of the elastic tube in contact with the first and second sealing surfaces has a lower hardness than the material constituting the first and second sealing surfaces.

3. The receiving container according to claim 1, wherein the receiving portion has a first circumferential flange upon which the securing device rests.

4. The receiving container according to claim 1, wherein the cover has a second circumferential flange upon which the securing device rests.

5. The receiving container according to claim 4, wherein the first sealing surface is provided at the first flange and the second sealing surface is provided at the second flange.

6. The receiving container according to claim 4, wherein the securing device is configured as a two-piece locking ring which encompasses the first and second flanges.

7. The receiving container according to claim 1, wherein the receiving portion has a receiving opening surrounded by a wall of the receiving portion, wherein the receiving opening transitions into the receiving space, wherein the cover is adapted to be inserted into the receiving opening, and wherein the first sealing surface is provided at a protrusion of the wall extending into the receiving opening.

8. The receiving container according to claim 7, wherein the wall has an internal thread and the securing device has an external thread which cooperates with the internal thread.

9. The receiving container according to claim 8, wherein the securing device clamping screws are arranged which press against the cover and interlock the securing device in the internal thread.

10. The receiving container according to claim 1, wherein the cover has at least one passage for inserting an insert with a getter element, an insert with a tube for evacuating the receiving space, or an insert for an electrical plug connector.

11. The receiving container according to claim 10, wherein the passage has a third sealing surface provided at a protrusion and the insert has a fourth sealing surface, wherein between the third and fourth sealing surfaces a further gasket is arranged.

12. The receiving container according to claim 10, wherein the insert is adapted to be screwed into the passage.

13. The receiving container according to claim 10, wherein a further securing device is adapted to be screwed into the passage and presses the insert against the further gasket.

14. The receiving container according to claim 13, wherein clamping screws are arranged in the further securing device which press against the insert and restrain the further securing device in the passage.

15. A detector system having a detector which operates in an ultrahigh vacuum or in a protective gas atmosphere consisting of high-purity gas and having a receiving container according to claim 1.

* * * * *